United States Patent [19]

Grupp et al.

[11] Patent Number: 5,032,006
[45] Date of Patent: Jul. 16, 1991

[54] ELECTROOPTICAL CELLS HAVING CONNECTION MEANS

[75] Inventors: Joachim Grupp, Peseux; Yves Ruedin, Saint-Blaise, both of Switzerland

[73] Assignee: Asulab, S.A., Bienne, Switzerland

[21] Appl. No.: 404,547

[22] Filed: Sep. 8, 1989

[30] Foreign Application Priority Data

Sep. 16, 1988 [CH] Switzerland ................ 03468/88

[51] Int. Cl.⁵ .............................................. G02F 1/13
[52] U.S. Cl. .................................. 350/331 R; 350/336
[58] Field of Search ................... 350/331 R, 336, 334

[56] References Cited

U.S. PATENT DOCUMENTS

| | | | |
|---|---|---|---|
| 3,781,087 | 12/1973 | Nagasaki | 350/334 |
| 3,781,088 | 12/1973 | Tsukamoto et al. | 350/333 |
| 3,914,021 | 10/1975 | Nishimura | 350/336 |
| 4,132,948 | 1/1979 | Gross | 350/336 |
| 4,277,143 | 7/1981 | Pauli et al. | 350/336 |
| 4,483,591 | 11/1984 | Baeger | 350/336 X |
| 4,514,042 | 4/1985 | Nukii et al. | 350/331 R |
| 4,640,581 | 2/1987 | Nakanowatari et al. | 350/331 R |
| 4,643,526 | 2/1987 | Watanabe et al. | 350/332 |
| 4,690,508 | 9/1987 | Jacob | 350/331 R |
| 4,690,510 | 9/1987 | Takamatsu et al. | 350/334 |

FOREIGN PATENT DOCUMENTS

| | | | |
|---|---|---|---|
| 0201938 | 10/1986 | European Pat. Off. | |
| 2399704 | 3/1979 | France | |
| 0070529 | 6/1981 | Japan | 350/336 |
| 0089719 | 7/1981 | Japan | 350/336 |
| 59-133 | 1/1984 | Japan | |
| 61-167925 | 7/1986 | Japan | |
| 2160693 | 12/1985 | United Kingdom | 350/332 |

OTHER PUBLICATIONS

Patent Abstracts of Japan, vol. 8, No. 82 (P-268)[1519], Apr. 14, 1984.
Patent Abstracts of Japan, vol. 10, No. 374 (P-527)[2431], Dec. 12, 1986.
*Electronics* article by L. S. Buchoff Entitled, "Conductive Elastomers Make Small, Flexible Contacts" vol. 47, No. 19, Sep. 19, 1974, pp. 122–125.

Primary Examiner—Stanley D. Miller
Assistant Examiner—Huy K. Mai
Attorney, Agent, or Firm—Pollock, Vande Sande & Priddy

[57] ABSTRACT

An electrooptical cell has electrical connection means between electrodes and a control unit which comprise a contact block of a synthetic adhesive material having conducting particles applied on the edge of each plate in contact zones which are provided flush with said edge, the contact block constituting both the electrical connection and the mechanical bond with at least one other element of said connection.

19 Claims, 3 Drawing Sheets

ELECTROOPTICAL CELLS HAVING CONNECTION MEANS

BACKGROUND OF THE INVENTION

The invention relates an improved electrooptical cell and, more specifically, to connection means designed to provide an electrical connection between the electrodes of the cell and its control unit respectively.

DESCRIPTION OF THE PRIOR ART

An electrooptical cell, such as a liquid crystal cell described in particular in U.S. Pat. Nos. 3,781,087 and 3,781,088, conventionally has a liquid crystal film situated between two glass plates each of which is coated on its interior surface with electrodes connected to a control unit. The plates are bonded together by an encasement extending around their circumference. The electrodes are covered by a first layer, termed the dielectric layer, and a second layer, termed the alignment layer. The first layer is designed to increase the specific resistance of the cell, whereas the second layer makes it possible to align the molecules of the crystal in the vicinity thereof in a homogenous direction parallel to the plates.

In order to effect the electrical connection between the electrodes and the control unit (by means of welding or the like), the plates are slightly offset with respect to each other so that it is possible to directly access a planar part of the electrodes and easily make the connection on the surface made accessible in this way.

However, such an operation necessitates special preparation of the surface to which the connection is to be made.

The two surface coatings covering the electrodes form an insulating layer through which it is difficult to make satisfactory contact. To overcome this problem a masking process is necessary, at the time when the surface coatings are deposited, to have the electrodes directly accessible in predetermined sites with a view to their subsequent connection.

The additional operations involved in selective deposition of this type are costly and time-consuming and should, if possible, be avoided.

Another way in which the above mentioned problem can be overcome consists in selectively removing the insulating coating by masking the rest of the surface using a process of the photolithographic type. Here again, lengthy and costly operations are involved.

Finally, a simpler solution consists in abrading this insulating layer, however, bearing in mind the thicknesses of the layers (of the order of a few hundred Angstroms), it is impossible to discriminate between these during the abrading process and the contact obtained is not satisfactory either.

OBJECTS OF THE INVENTION

The main object of the instant invention is therefore to overcome the disadvantages of the prior art described hereinabove by providing an improved electrooptical cell in which the electrodes are connected to the control unit in a simple, quick and economical manner.

BRIEF SUMMARY OF THE INVENTION

The object of the instant invention is therefore to provide an electrooptical cell comprising:
a first transparent front plate,
a second back plate,
a sealing frame interposed between said first and second plates,
at least one electrode extending along the surface of each plate and which is at least partially flush with the edge of the corresponding plate to define a contact zone there,
a material having electrooptical characteristics that can be modified by a control signal and enclosed in the volume defined by the plates and the sealing frame,
said electrodes being designed to be connected to a control unit in order to selectively apply said control signal thereon,
and connection means to establish electrical connections between each electrode and said control unit respectively.

In accordance with the invention, said connection means comprise a contact block made of a synthetic adhesive material charged with conducting particles and applied on the edge of each plate in said contact zone, said contact block ensuring both the electrical connection and the mechanical bond with at least one other element of said connection means.

The electrodes are thus simply and reliably connected with the control unit without it being necessary to mask the connection points whilst the dielectric layer and the alignment layer are deposited on the electrodes.

In addition, a connection of this type protects the electrodes from corrosion.

In a preferred embodiment the adhesive synthetic material is an epoxy resin and the conductive particles are metal particles.

BRIEF DESCRIPTION OF THE DRAWINGS

Other characteristics and advantages of the invention will be apparent from a study of the following description of non-limiting embodiments with reference to the enclosed drawings, in which.

DETAILED DESCRIPTION OF THE INVENTION

Figure 1:
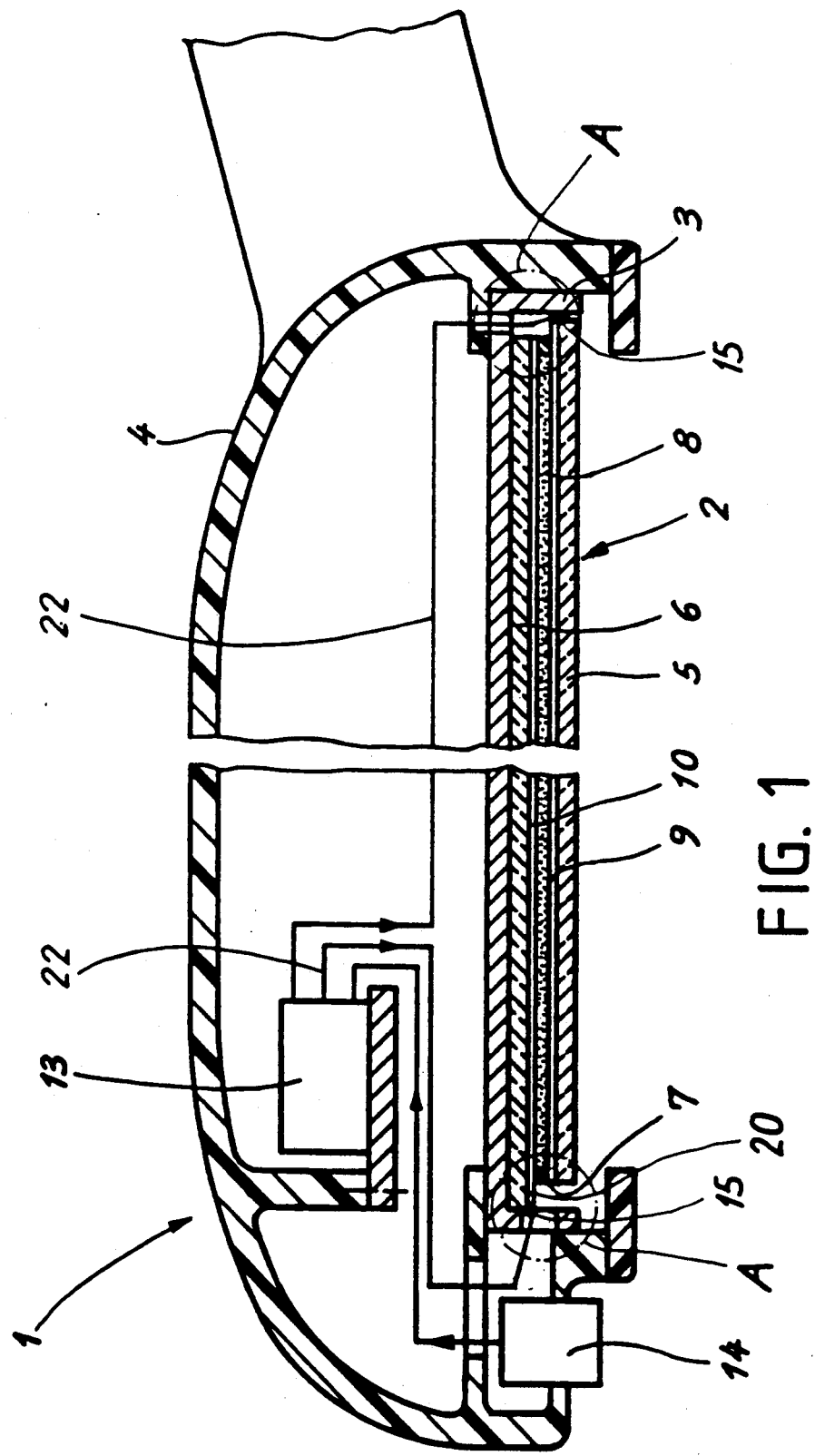
FIG. 1 shows a cross section of an automobile rear view mirror incorporating an improved electrooptical cell of the invention.

Referring initially to FIG. 1 there is shown an automobile rear view mirror designated by the general reference 1 comprising an improved liquid crystal cell 2 of the invention. For purposes of example, the cell is substantially rectangular in shape.

The cell 2 is mounted in a frame 3, the latter being fixed by adhesion in the housing 4 of the rear view mirror 1.

This cell 2 comprises, in conventional manner, a transparent front plate 5 which has undergone anti-reflection treatment and a back plate 6, the two plates 5 and 6 being joined together by a sealing frame 7 defining a sealed volume in which there is contained a mixture 8 composed of a nematic liquid crystal and a dichroic dye.

The front plate 5 has, on its inside face, a transparent electrode 9 extending over the whole plate, for example a mixture of indium/tin oxides, as well as a dielectric layer and an alignment layer not shown in this figure.

The whole of the inside face of the back plate 6 has a counter electrode 10, a reflecting layer capable of constituting said counter electrode, and a dielectric layer and an alignment layer not shown.

Also visible is an electrical control housing 13 which comprises an input connected to a photosensitive transducer 14, this housing delivering a control signal, representative of the intensity of the light received by the transducer, towards two outputs connected to the electrode 9 and the counter electrode 10 respectively in order to control the degree of absorption of the cell 2.

Finally, there are also shown connection means 15 surrounded by a circle composed of a broken line and designated with the letter A. According to the invention, these connection means 15 are designed to establish an electric connection between each electrode 9, 10 respectively and the control unit 13 which will be described in greater detail hereinbelow with reference to FIGS. 2 to 4.

Figure 2:
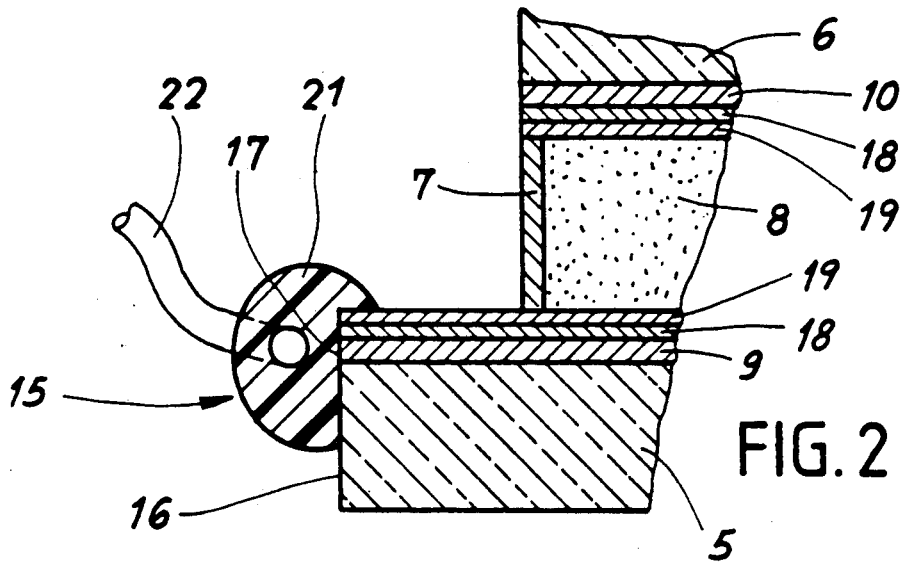
FIG. 2 is a large-scale view of the part surrounded by a broken line and designated with the letter A on FIG. 1, FIGS. 3 and 4 are partial sectional views of two embodiments of the invention.

FIG. 2 shows an enlarged view of the connection means 15 shown in FIG. 1.

The electrodes 9, 10 respectively cover the plates 5, 6 in their entirety and said electrodes are flush with the side edge 16 of the plates, so defining a side contact zone 17. This contact zone 17 extends around the circumference of each plate 5, 6.

The electrodes 9, 10 are entirely covered by the dielectric layer 18 and the alignment layer 19. These layers 18 and 19 also extend to the surface of the plates to be flush with the edge 16 so that contact with the electrodes 9, 10 cannot be directly made by contact with the surface 20 because it is covered by these layers.

For purpose of clarity it should be noted that the thickness of the electrodes and those of the two other aforementioned layers are of the order of a few hundred Angstroms.

In accordance with the invention the connection means 15 comprise a contact block 21 associated with each electrode 9, 10. This contact block 21 is made of a synthetic adhesive material charged with conducting particles and is applied to the edge 16 in the contact zone 17 of each of the plates 5, 6.

This contact block 21 composed of the aforementioned adhesive material thus ensures both the electrical connection and the mechanical bond between another connection element connected to the control unit and to the cell.

In this case, said other element connecting the cell to the control unit is a conducting wire 22, one end of which is buried in the mass of the block 21.

In practical terms, the block 21 is composed of a conductive epoxy adhesive, the latter being charged with particles of silver or analogous material. This type of adhesive can, for example be obtained from "PROTEX" under the brand name "Protonic".

The adhesive may be applied using a brush or by any other suitable means. Care must, however, be taken to ensure that it is applied in sufficient amounts to establish an intimate contact with the electrode in order to ensure a satisfactory contact.

Figure 3:
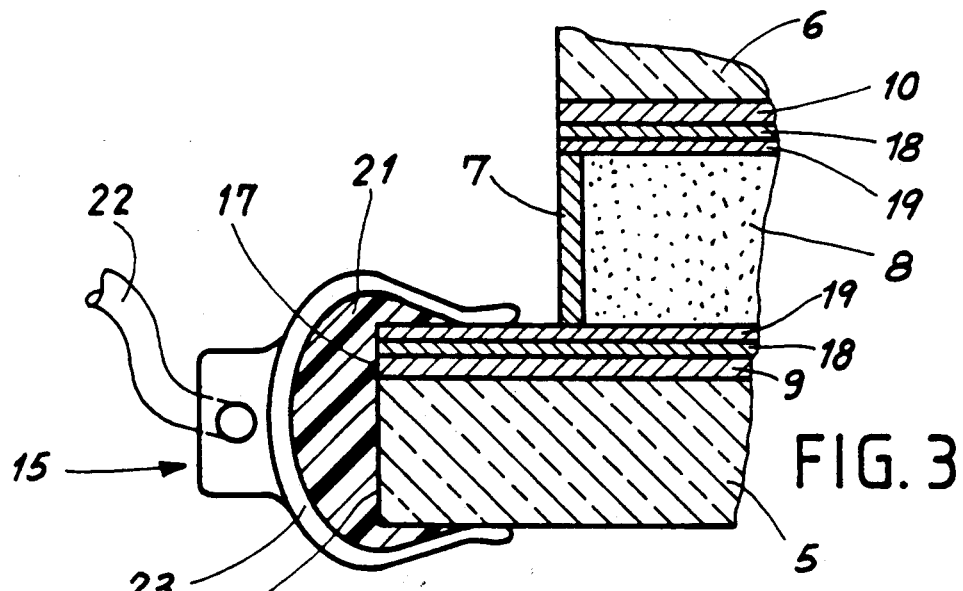
Figure 4:
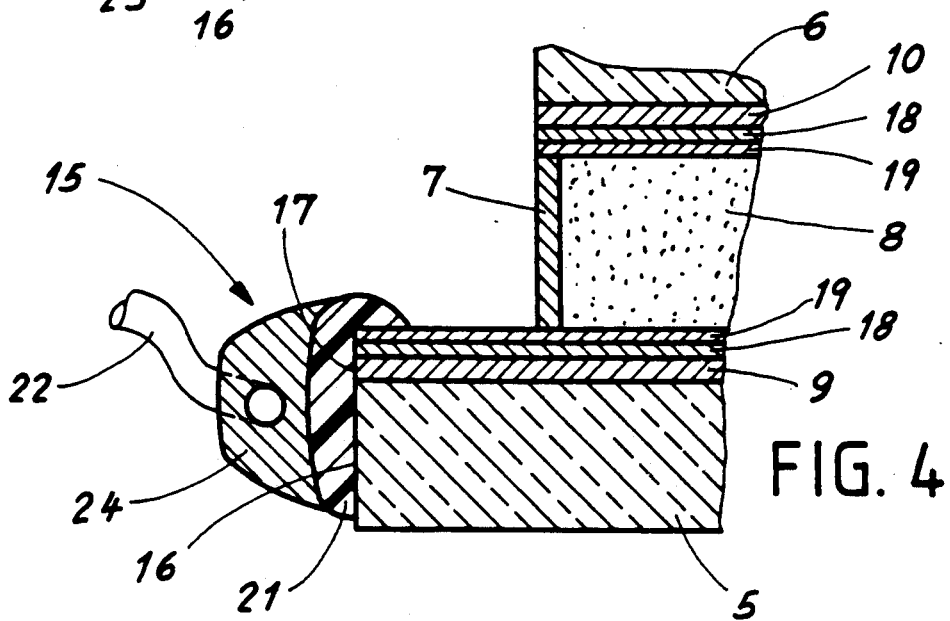

FIGS. 3 and 4 show two embodiments of an improved cell according to the invention in which are designated elements identical to those described earlier using the same reference numerals.

In the embodiment shown in FIG. 3, after having applied the conductive adhesive in the contact zone 17, the contact block 21 formed by this latter is connected to the control unit by means of a clip 23 which forms the other element of the connection means of the invention.

This clip 23 connected to the control unit 13 by a conducting wire 22 is arranged to hold the plate 5 firmly as well as to cover the block 21 in order to effect electrical contact. The electrical connection to the control unit is thus effected in a reliable manner whilst strengthening the mechanical bond between the cell and the conducting wire.

The block 21 advantageously fills the entire base of the clip 23 and the clip is put in place before the adhesive has dried.

Reference now being made to the embodiment shown in FIG. 4, the control block 21 constitutes a substrate for a metal weld 24 comprising, buried in its mass, the end of a conducting wire 22 connected to the control unit.

In this case the contact block 21 created by the conductive adhesive extends into the contact zone 17 over a sufficiently large surface for the metal weld applied to make an effective electrical contact as well as an effective mechanical bond with the contact block 21.

It will be noted that in the illustrated examples described above, plates 5, 6 of the cell are slightly offset in relation to one another. In all these instances, the offsetting simply serves to connect the electrode fitted to each of the plates without any risk of a short circuit between them.

Of course, if one wished to connect a cell according to the invention without this offsetting, it would be sufficient to deposit the electrode on each of the plates in such a way that on at least one lateral extremity of the plate one of the electrodes is not flush with the edge thereof.

The invention is particularly interesting in the case of cells having only one electrode each per plate covering the entire surface thereof, but it will be noted that this invention can also be advantageously used in cells in which each plate comprises a plurality of electrodes arranged selectively according to a predetermined configuration, notably in classic liquid crystal display cells.

Figure 5:
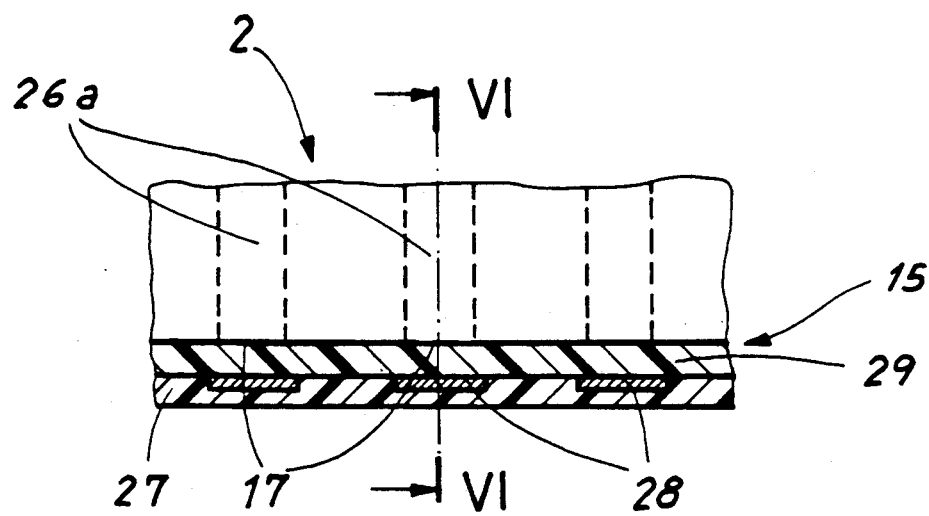
FIG. 5 is a top sectional view of an electrooptical cell connected to a printed circuit support according to the invention.
Figure 6:
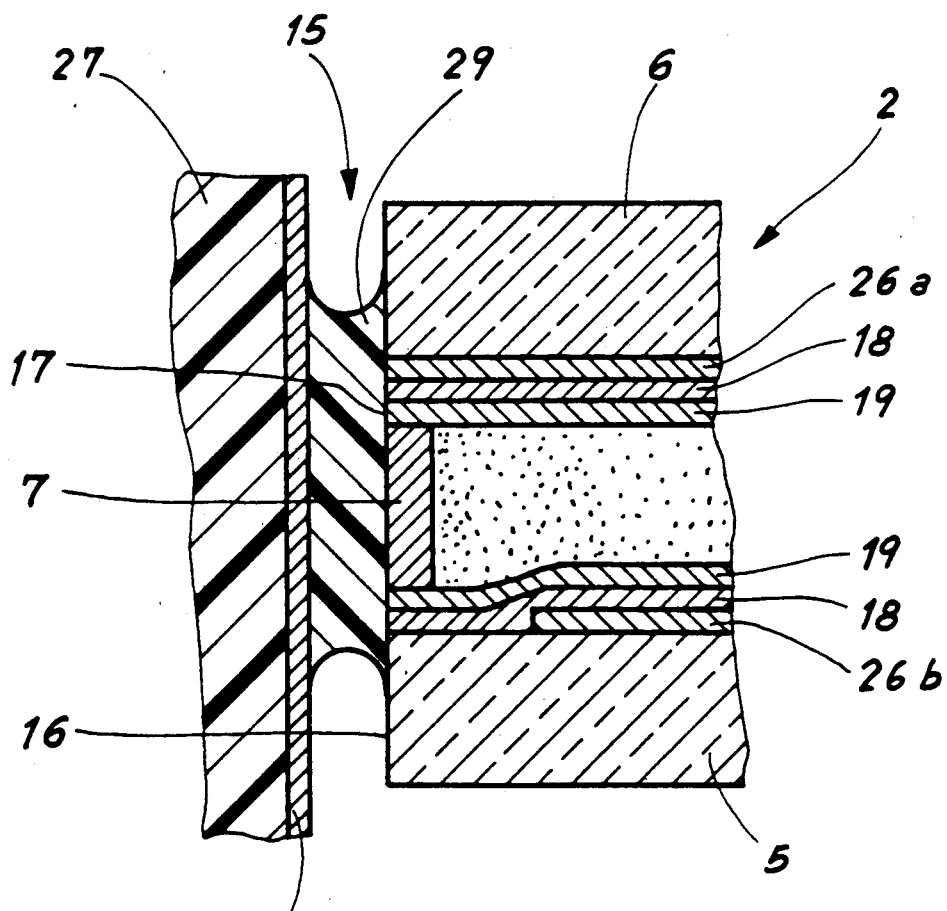
FIG. 6 is a cross sectional view along the line VI—VI of FIG. 5.

In another embodiment shown in FIGS. 5 and 6 a liquid crystal display cell 2 is partially visible comprising a plurality of electrodes 26a, 26b selectively disposed on each of the plates 5 and 6. This cell 2 is connected to a control unit (not shown) by means of a printed circuit support 27 carrying a plurality of strip conductors 28 each associated with an electrode 26a.

The connection between the strip conductors and the electrodes is ensured here by a seal of anisotropic conductive adhesive 29 arranged between the strip conductors 28 carried by the support essentially in the contact zone 17 associated with an end portion of each of the electrodes 26a located at the side edge 16 of the cell.

As is clearly visible on FIG. 6, in those places where the electrodes 26b carried by the plate 5 do not extend up to the extremity of the latter, the inside surface of plate 5 beyond the ends of the electrodes 26b is covered by the dielectric layer 18 and the alignment layer 19. This configuration makes it possible to avoid a short circuit between the electrodes 26a and the electrodes 26a carried by the plate 6 during connection.

In contrast, it will be seen that the dielectric layer 18 and the alignment layer 19 have not been deposited selectively and cover the entire surface of the plate 5 as well as the plate 6. This avoids the masking operations which would have been necessary using a classic connection.

In addition, the connection of the support 27 and of the cell 2 by the edge 17 thereof no longer requires the classic offsetting of the plates, making the assembly thereby obtained advantageously compact.

We claim:

1. An electrooptical cell comprising:
   a first transparent front plate of a nonconductive material,
   a second back plate of a nonconductive material,
   a sealing frame interposed between said first and second plates,
   at least one electrode extending along the surface of each of said plates and which has an end portion at least partially flush with a side edge of the corresponding plate to define a side contact zone there, a first surface of each of said electrodes adjacent to said side contact zone being electrically insulated by said corresponding plate,
   a layer of a nonconductive material extending over each of said electrodes to electrically insulate a second surface thereof adjacent to said side contact zone and opposite to said first electrode surface,
   a material switchable between a plurality of optically distinguishable states in response to a control signal applied to said electrodes and enclosed in a volume defined by said plates and said sealing frame,
   said electrodes being designed to be connected to a control unit for selectively applying said control signal thereto, and
   connection means for establishing electrical connections between each of said electrodes and said control unit respectively, said connection means comprising a contact block made of a synthetic adhesive material charged with conducting particles and applied on the side edge of each of said plates in said said contact zone, said contact block ensuring both an electrical connection and a mechanical bond with at least one other element of said connection means.

2. A cell according to claim 1, wherein the synthetic adhesive material is an epoxy resin and the conducting particles are metal particles.

3. A cell according to claim 1, wherein said one other element of said connection means is a clip.

4. A cell according to claim 1, wherein said one other element of said connection means is a metal weld.

5. A cell according to claim 1, wherein the adhesive synthetic material charged with conducting particles is an anisotropic conducting adhesive.

6. A cell according to claim 1 wherein the electrooptical cell is a liquid crystal cell.

7. An automobile rear view mirror incorporating an electrooptical cell, said cell comprising:
   a transparent front plate of a nonconductive material;
   a back plate of a nonconductive material;
   a sealing frame interposed between said front and back plates;
   at least one electrode extending along the surface of each of said plates and having an end portion at least partially flush with a side edge of the corresponding plate to define a side contact zone there, a first surface of each of said electrodes adjacent to said side contact zone being electrically insulated by said corresponding plate;
   a layer of a nonconductive material extending over each of said electrodes to electrically insulate a second surface thereof adjacent to said side contact zone and opposite to said first electrode surface;
   a material switchable between a plurality of optically distinguishable states in response to a control signal applied to said electrodes and enclosed in a volume defined by said plates and said sealing frame, said electrodes being designed to be connected to a control unit for selectively applying said control signal thereto; and,
   connection means for establishing electrical connections between each of said electrodes and said control unit respectively, said connection means comprising a contact block made of a synthetic adhesive material charged with conducting particles and applied on the side edge of each of said plates in said side contact zone, said contact block ensuring both an electrical connection and a mechanical bond with at least one other element of said connection means.

8. An automobile rear view mirror according to claim 7 further comprising an element adapted to deliver a control signal dependent on the intensity of the light impinging on said element, whereby the transparency of the cell varies in response to this control signal.

9. An automobile rear view mirror according to claim 7 wherein the synthetic adhesive material is an epoxy resin and the conducting particles are metal particles.

10. An automobile rear view mirror according to claim 7 wherein said other element of said connection means is a clip.

11. An automobile rear view mirror according to claim 7 wherein said other element of said connection means is a metal weld.

12. An automobile rear view mirror according to claim 7 wherein the synthetic adhesive material charged with conducting particles is an anisotropic conducting adhesive.

13. An automobile rear view mirror according to claim 7, wherein the electrooptical cell is a liquid crystal cell.

14. An automobile rear view mirror according to claim 13 also comprising an element adapted to deliver a control signal dependent on the intensity of the light impinging on said element, whereby the transparency of the cell varies in response to this control signal.

15. An automobile rear view mirror according to claim 13 wherein the synthetic adhesive material is an epoxy resin and the conducting particles are metal particles.

16. An automobile rear view mirror according to claim 13 wherein said other element of said connection means is a clip.

17. An automobile rear view mirror according to claim 13 wherein said other element of said connection means is a metal weld.

18. An automobile rear view mirror according to claim 13 wherein the synthetic adhesive material charged with conducting particles is an anisotropic conducting adhesive.

19. An electrooptical cell comprising:
   a transparent front plate of a nonconductive material;
   a back plate of a nonconductive material;
   a sealing frame interposed between said front and back plates;

at least one electrode extending along the surface of at least one of said plates and having an end portion at least partially flush with a side edge of the corresponding plate to define a side contact zone there, a first surface of said electrode adjacent to said side contact zone being electrically insulated by said corresponding plate;

a layer of a nonconductive material extending over said electrode to electrically insulate a second surface thereof adjacent to said side contact zone and opposite to said first electrode surface;

a material switchable between a plurality of optically distinguishable states in response to a control signal applied to said electrode and enclosed in a volume defined by said plates and said sealing frame, said electrode being designed to be connected to a control unit for selectively applying said control signal thereto; and, connection means for establishing electrical connections between said electrode and said control unit respectively, said connection means comprising a contact block made of a synthetic adhesive material charged with conducting particles and applied on the side edge of said corresponding plate in said contact zone, said contact block ensuring both an electrical connection and a mechanical bond with at least one other element of said connection means.

* * * * *

UNITED STATES PATENT AND TRADEMARK OFFICE
CERTIFICATE OF CORRECTION

PATENT NO. : 5,032,006
DATED : July 16, 1991
INVENTOR(S) : Joachim Grupp and Yves Ruedin It is certified that error appears in the above-identified patent and that said Letters Patent is hereby corrected as shown below:

Column 5, line 42, change the second occurrence of "said" to --side--

Signed and Sealed this

Thirteenth Day of October, 1992

Attest:

DOUGLAS B. COMER

Attesting Officer

Acting Commissioner of Patents and Trademarks